United States Patent [19]

Mizutani et al.

[11] Patent Number: 4,864,123

[45] Date of Patent: Sep. 5, 1989

[54] APPARATUS FOR DETECTING THE LEVEL OF AN OBJECT SURFACE

[75] Inventors: Hideo Mizutani, Yokohama; Isao Sato, Tokyo; Masato Shibuya, Kawasaki, all of Japan

[73] Assignee: Nikon Corporation, Tokyo, Japan

[21] Appl. No.: 189,831

[22] Filed: May 3, 1988

[30] Foreign Application Priority Data

May 8, 1987 [JP] Japan ................................ 62-111889
Jun. 15, 1987 [JP] Japan ................................ 62-148624
Jun. 15, 1987 [JP] Japan ................................ 62-148625

[51] Int. Cl.[4] ........................... G01C 3/00; G02F 1/01

[52] U.S. Cl. .................................... 250/225; 250/561; 356/1; 356/4; 356/369

[58] Field of Search ............... 250/225, 201, 204, 561; 356/1, 4, 364, 369, 370

[56] References Cited

U.S. PATENT DOCUMENTS 3,601,613 8/1971 Hock .................................. 250/225
3,985,447 10/1976 Aspnes ................................ 356/369
4,650,983 3/1987 Suwa .................................. 250/204

FOREIGN PATENT DOCUMENTS 56-42205 4/1981 Japan .

*Primary Examiner*—Edward P. Westin
*Attorney, Agent, or Firm*—Shapiro and Shapiro

[57] ABSTRACT

An apparatus for detecting the level of an object surface comprises a light source for supplying a light beam obliquely incident on the object surface, an imaging optical system provided to image the light beam reflected by the object surface, a light-receiving element having a detecting surface coincident with the imaging plane of the imaging optical system and determining the level of the object surface on the basis of the position of the image of the light beam on the detecting surface, and polarization correcting optics provided on an optical path leading from the light source via the object surface to the detecting surface for adjusting the intensity ration between the two mutally orthogonal polarized light components of the light beam.

9 Claims, 14 Drawing Sheets

FIG. 6A θi < BREWSTER'S ANGLE
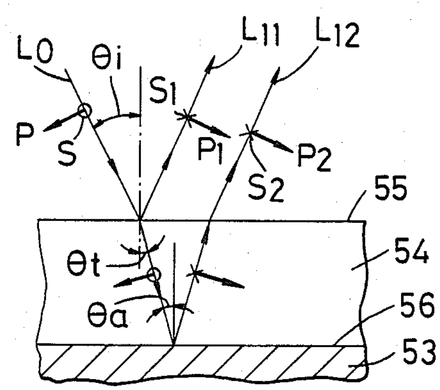
FIG. 6B θi > BREWSTER'S ANGLE
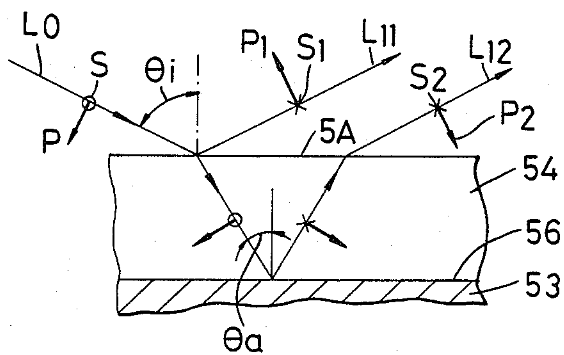

APPARATUS FOR DETECTING THE LEVEL OF AN OBJECT SURFACE

BACKGROUND OF THE INVENTION

1. Field of the Invention

This invention relates to an apparatus for detecting the level of an object surface, and in particular to an apparatus useful for making the surface of a photosensitive substrate coincident with the focal plane of a projection optical system, for example, in precise photography 2. Related Background Art In a projection exposure apparatus for the manufacture of semiconductor devices, as a device for detecting the focus position of a projection optical system, a system whereby an incident light is obliquely applied to a semiconductor wafer provided at a position whereat the image of a mask pattern is formed by a projection lens and the level of the surface of the semiconductor wafer is detected on the basis of the reflected light obliquely reflected from the surface of the semiconductor wafer is disclosed, for example, in Japanese Laid-Open Patent Application No. 56-42205 and U.S. Pat. No. 4,650,983 which is an improvement thereof.

According to this known position detecting system, a light beam is obliquely projected onto an object surface to form a slit-like optical image on the object surface and the reflected light therefrom is re-imaged on a detector constructed of a photoelectric conversion element. Correspondingly to a change in the level of the object surface, the position of the reflected optical image on the detector shifts on the detector. By detecting the amount of this shift, it is possible to determine whether the object surface is coincident with the focal plane of the projection lens.

However, when the surface position of a semiconductor wafer is to be actually detected by the use of the prior-art position detecting system constructed as described above, it has been found that there is a certain limit in the position detecting accuracy thereof. When the cause of it has been examined variously, it is often the case with the surface portion of a semiconductor wafer that a thin film such as photoresist adhered to a semiconductor substrate such as silicon, and when the thickness of the thin film has become the order of 1 to 2 $\mu$m, interference is caused between the reflected light reflected by the surface of the thin film and the light transmitted through the surface of the thin film and reflected by the surface of the semiconductor substrate, and this is considered to cause a variation in the distribution of light intensity in a direction perpendicular to the optic axis of the reflected light. Incidentally, the light ray transmittance of a material formed of an organic substance, such as photoresist, is generally relatively high for a wavelength longer than the sensitizing wavelength (e.g., red light), and this has led to the problem that the reflected light from the front surface of the photoresist layer and the reflected light from the back surface thereof are liable to interfere with each other, thus causing an error.

SUMMARY OF THE INVENTION

It is a primary object of the present invention to realize, with the influence of the interference between reflected lights taken into account, a surface displacement detecting apparatus whose detection accuracy can be improved more beyond the limit of the prior-art apparatus.

In the detecting apparatus of the present invention, polarizing optical means for arbitrarily changing the intensities of a P-polarized light component and an S-polarized light component on a detecting surface is provided at a predetermined position on an optical path leading from a light source to an object surface or on an optical path leading from the object surface to said detecting surface.

The reflected light reflected by the object surface interferes in conformity with the thickness of a thin film on the object surface and makes interference fringes on the detecting surface. The interference fringe by the S-polarized light of this reflected light and the interference fringe by the P-polarized light of said reflected light are 180° out of phase with each other because the incidence angle varies with Brewster's angle as the boundary. Accordingly, the variation in the light intensity obtained with the coherent light of the S-polarized light component and the coherent light of the P-polarized light component which are inverted in phase with each other being combined together is not proportional to the film thickness, but is greatly disturbed. So, the polarizing optical means is provided at a suitable position on the detection optical path to vary the ratio between the P-polarized light component and the S-polarized light component, and when the intensities of the two polarized light components are suitably varied by suitably rotatively adjusting the polarizing optical means by the utilization of the phase difference of 180° between the P-polarized light component and the S-polarized light component, the apparent amount of surface deviation on the object surface becomes smaller and thus, the detection error can be improved.

It is another object of the present invention to provide said polarizing optical means, and more particularly a polarizing device which can easily change the intensity ratio between two polarized light components whose directions of polarization are perpendicular to each other to any value and can again combine the changed two polarized light components efficiently and emit them.

In one mode of the present invention, said polarizing device includes means for separating the incident light into two polarized light components whose directions of polarization are perpendicular to each other, means for arbitrarily changing the intensity ratio between said two separated polarized light components, and means for combining said two polarized light components whose intensity ratio has been changed and forming a composite beam emerging in one direction.

BRIEF DESCRIPTION OF THE DRAWINGS

FIGS. 6A and 6B respectively illustrate the polarized conditions of the reflected light when the angle of incidence is smaller than Brewster's angle and when the angle of incidence is greater than Brewster's angle.

DESCRIPTION OF THE PREFERRED EMBODIMENTS

Figure 1:
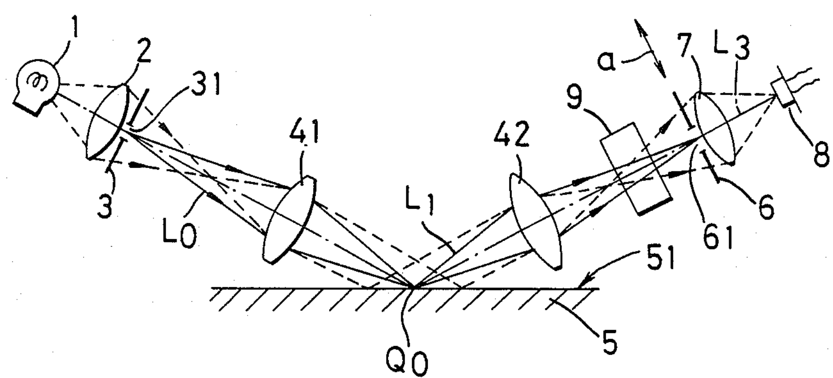
FIG. 1 schematically shows the construction of an optical system according to a first embodiment of the present invention.

FIG. 1 shows the optical system of an oblique incidence type surface level detecting apparatus. The paths of light rays indicated by solid lines show the conjugate relation of a slit image, and the paths of light rays indicated by broken lines show the conjugate relation of a light source image.

A detecting light from a light source 1 emitting a so-called random-polarized light which does not have a particular direction of polarization, such as a light-emitting diode (LED) or a halogen lamp, illuminates a slit plate 3 through a field lens 2. The slit plate has a slit 31 which is long in a direction perpendicular to the plane of the drawing sheet, and a light beam $L_0$ projected through the slit 31 is condensed by an objective lens 41 and a slit image is formed on the surface 51 of a wafer 5. A reflected light $L_1$ reflected from the surface 51 is condensed by an objective lens and a slit image is again formed on a slit plate 6. Also, the reflected light $L_1$ passed through a slit 61 formed in the slit plate 6 is condensed as a detecting light $L_3$ on a light-receiving element 8 such as a photoelectric conversion element by a collector lens 7. The slit plate 6, the collector lens 7 and the light-receiving element 8 together constitute a position detector.

The lengthwise direction of the slit 61, like that of the slit 31, is set to a direction perpendicular to the plane of the drawing sheet. The slit plate 6 vibrates in a direction indicated by arrow a. Thus, the slit image re-formed on the slit plate 6 is scanned by the slit 61, and the displacement of the wafer surface from the reference plane (the focal plane) may be determined from the amount of deviation of the slit from the reference position when the detection signal from the light-receiving element 8 becomes maximum.

Figure 2:
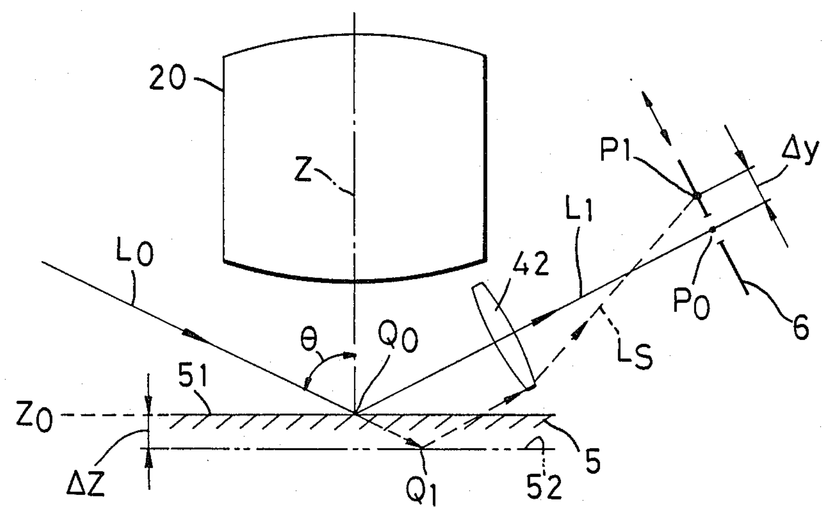
FIG. 2 is an illustration showing the change in the position of a spot image.

A correcting optical system 9 is disposed on the optical path between the objective lens 42 and the slit plate 6. This correcting optical system 9 will be described later in detail. FIG. 2 shows the amount of displacement of the slit image on the slit plate 6 when the wafer surface 51 is displaced along the optic axis Z of a projection lens 20. When the incident light $L_0$ is incident on the surface 51 lying at a reference height $Z_0$ at an angle of incidence $\theta$, a slit image formed at a point $Q_0$ is re-formed at a reference position $P_0$ on the slit plate 6 by the objective lens 42. When the surface 51 is displaced by $\Delta Z$ to a position 52 in a direction Z, the incident light $L_0$ is reflected at a point $Q_1$ and a reflected principal ray $L_S$ reaches a point $P_1$ on the slit plate 6 through the objective lens 42, and a slit image is re-formed thereat. In this case, if the amount of displacement of the slit image from the reference position $P_0$ on the slit plate 6 to the point $P_1$ is $\Delta y$ and the imaging magnification of the objective lens 42 is $\beta$, the amount of displacement $\Delta Z$ of the surface 51 is given by $$\Delta Z = \Delta y/(2\beta \sin \theta) \quad (1)$$

Figure 3:
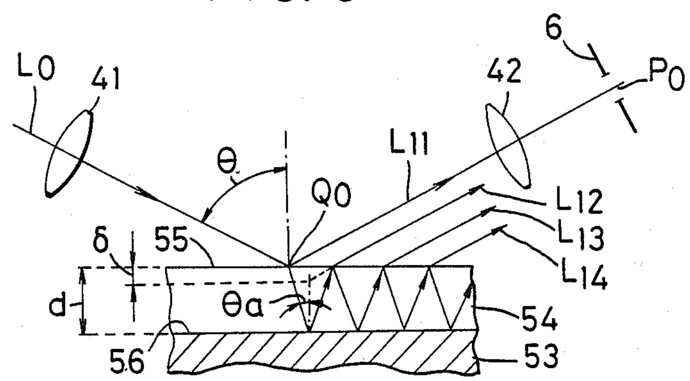
FIG. 3 illustrates a reflected light reflected by a thin film.

On the other hand, where the object surface, as shown in FIG. 3, is constructed of the surface 55 of a thin film 54 formed, for example, of photoresist applied onto a semiconductor substrate 53, part of a light beam $L_0$ incident at a point $Q_0$ on the surface 55 is not only reflected as a reflected light L11, but also is transmitted through the thin film 54 and reflected by the surface 56 of the substrate 53, and is transmitted through the surface 55 and emerges as a second reflected light L12. Thereafter, in a similar manner, third, fourth, . . . reflected lights L13, L14, . . . are produced, and these are considered to be combined with the first reflected light L11 and reach the slit plate 6.

Examining this combined reflected light, the second reflected light L12 once reflected in the interior of the thin film 54 can be considered to have been reflected at a position apparently as deep as a distance $\delta$ from the surface 55 and thus, on the slit plate 6, it is imaged while laterally deviating by an amount of deviation e represented by $$\epsilon = 2 \cdot \beta \cdot \sin \theta \cdot \delta \quad (2)$$

with the incident position $P_0$ of the regular reflected light L11 as the reference. Here, the apparent amount of deviation $\delta$ of the surface 55 can be found as $$\delta = \frac{d \cdot \cos\theta}{\sqrt{n^2 - \sin\theta}} . \quad (3)$$

In equation (3), d is the thickness of the thin film 54 and n is the refractive index of the thin film 54. Reflected lights obtained by being reflected two times, three times, . . . , m times in the interior of the thin film 54 likewise deviate in position by $2\epsilon$, $3\epsilon$, . . . , $m\epsilon$.

These reflected lights interfere with one another on the basis of the conditions of the optical system and the thickness d of the thin film. As a result, the shape of the image formed on the slit plate 6 is deformed with a result that the centroid of the quantity of light detected by the position detector deviates, whereby an error occurs to the result of the detection of the amount of deviation $\Delta y$ based on the regular reflected light L11.

This phenomenon may be qualitatively examined as shown in FIGS. 4A–4D.

Figure 4A:
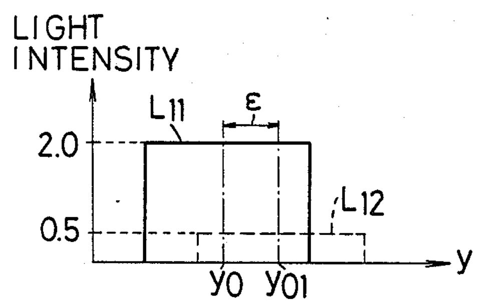
FIGS. 4A, 4B, 4C and 4D illustrate the movement of the centroid of the quantity of light.

First, let it be assumed that when only the first reflected light L11 has reached the slit plate 6, the position detector judges the position of this centroid of the quantity of light as $y_0$ and with regard to the second reflected light L12 once reflected in the interior of the thin film 54, the position detector judges in accordance with equation (2) that the centroid of the quantity of light thereof is at a position $y_{01}$ deviated by an amount of positional deviation $\epsilon$. In this case, assuming that as shown in FIG. 4A, the light intensity of the reflected light L11 is a normalized value 2.0, the light intensity of the second reflected light L12 is weaker than this value, say, approximately 0.5.

Figure 4B:
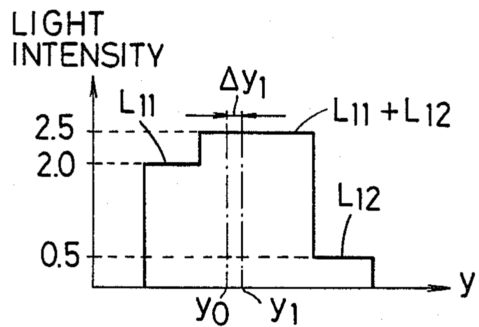

Now, if the thickness d of the thin film 54 is sufficiently great and the light beam $L_0$ from the light source 1 is of low coherence, there occurs no interference between the first reflected light L11 and the second reflected light L12. Accordingly, the light intensity of the slit image formed on the slit plate 6 presents a distribution of light intensity represented by the sum of the distribution of light intensity of the first reflected light L11 and the distribution of light intensity of the second reflected light L12, as shown in FIG. 4B. As a result, the centroid of the quantity of light of the distribution of light intensity of the slit image formed on the slit plate 6 appears at a position $y_1$ deviated by a slight amount of deviation $\Delta y_1$ relative to the centroid $y_0$ of the distribution of light intensity of the reflected light L11. However, the amount of deviation $\Delta y_1$ varies in proportion to the thickness d of the thin film.

Actually, however, the thickness of the thin film d is as small as the order of 1–2 $\mu$m and therefore, the reflected light therefrom is high in potentiality of interference and in many cases, the reflected lights L11 and L12 interfere with each other and these two lights strengthen each other or weaken each other. Thus, the phenomenon that the shape of the combined image formed on the slit plate 6 is destroyed occurs, whereby the centroid of the quantity of light of the combined image deviates greatly from the centroid $y_0$ of the quantity of light.

Figure 4C:
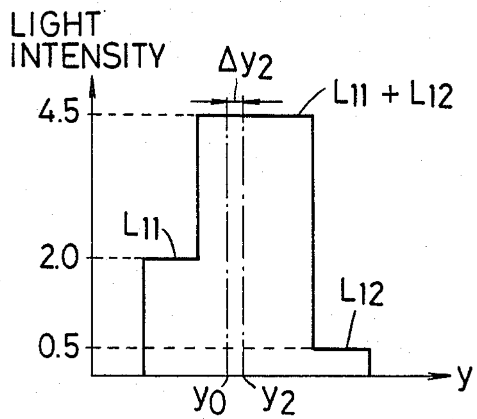

For example, when the interference light intensity of the reflected light L12 relative to the reflected light L11 has become maximum, as shown in FIG. 4C, the light intensity of the interference portion L11+L12 becomes extremely great (in the case of the present embodiment, the light intensity of the reflected light is 4.5). The result is that the centroid of the quantity of light of the image moves to a position $y_2$ deviated by a greater amount of deviation $\Delta y_2$ than in the case of FIG. 4B.

Figure 4D:
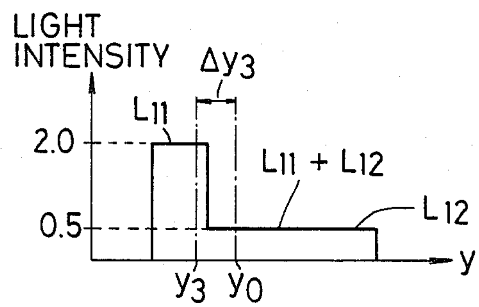

In contrast, when the interference light intensity is minimum, as shown in FIG. 4D, the reflected lights L12 and L11 negate each other within a range over which they overlap each other, with a result that the centroid of the quantity of light of the combined image moves by an amount of positional deviation $\Delta y_3$ extremely great as compared with the centroid $y_0$ of the quantity of light and moreover to a position $y_3$ deviated to the opposite side from FIG. 4C. Particularly in the case of FIG. 4D, the amount of positional deviation $\Delta y_3$ is great, and this is a factor which causes a very great error in the determination of the position.

Figure 5:
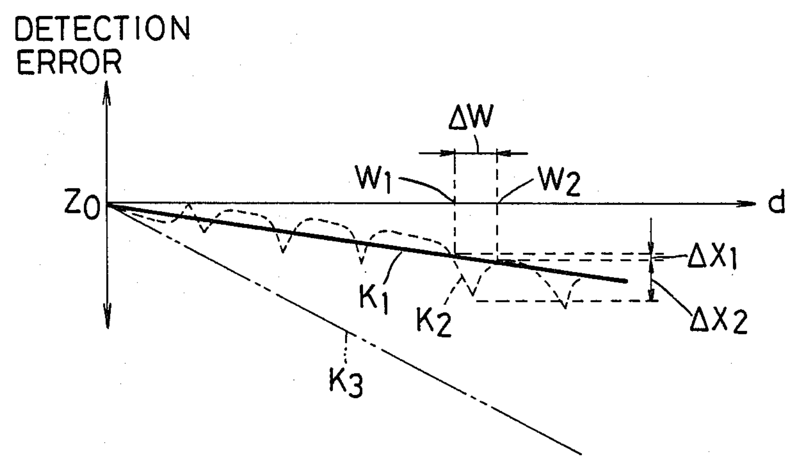
FIG. 5 is a graph showing a detection error for the film thickness.

FIG. 5 graphically shows the influence the interference of the reflected lights as described above imparts to the detected position, and the horizontal axis represents the thickness d of the thin film and the vertical axis represents the detection error of the position detector with the surface 55 of the thin film as the reference. A straight line K3 indicated by phantom line is indicative of the position of the upper surface 56 of the semiconductor substrate 53.

Assuming that the reflected lights do not interfere with each other, the light intensities of the reflected lights from the surface 55 of the thin film and the surface 56 of the substrate are determined by the reflectances on the reflecting surfaces and constant. However, the reflected lights L12, L13, . . . from the surface 56 of the substrate deviate relative to the reflected light L11 in proportion to the thickness d of the thin film. Thus, the position of the centroid of the quantity of light of the slit image deviates from the detection reference position $P_0$ in proportion to the thickness d of the thin film. Accordingly, the position detector indicates a linear detection error proportional to the film thickness d as shown by solid line K1 with the level $Z_0$ of the surface 55 of the thin film as the reference.

However, when the interference phenomenon occurs as previously described, there is caused deviation not proportional to the film thickness d which waves greatly along the solid line K under the influence of the interference, as indicated by a curve (broken line) K2. Particularly, as described with respect to FIG. 4D, sharply pointed thorn-like extreme deviation occurs in the vicinity of the film thickness for which the reflected lights negate each other. Under such a situation assuming that for example, the thickness d of the thin film 54 is irregular within a range from $W_1$ to $W_2$ ($W_1-W_2=\Delta W$) in the manufacturing process as shown in FIG. 5, where the reflected light are incoherent (solid line K1), the result of the detection is only irregular by $\Delta X_1$, but in the case of a curve K2 which indicates that the reflected lights interfere with each other, the result of the detection becomes greatly irregular within the maximum range of $\Delta X_2$.

Now, in the description of the influence of the interference in FIG. 4, only the first reflected light L11 and the second reflected light L12 have been qualitatively described, but actually, the reflection takes place infinite times as shown in FIG. 3 and is very complicated. However, as compared with the first reflected light L11 and the second reflected light L12, the light intensities of the other reflected lights are weak and therefore, no great error will occur even if the influence of the interference is typified by only said reflected lights L11 and L12.

Generally, a reflected light includes therein P-polarized light parallel to the incidence surface (perpendicular to the object surface) and S-polarized light perpendicular to the incidence surface, and with regard to the amplitude and phase of the light, the following Fresnel's equations are established. When the angle of incidence is $\theta i$ and the angle of refraction is $\theta t$ and the amplitude of P-polarized light is $R_P$ and the amplitude of S-polarized light is $R_S$, $$R_P=-\tan(\theta i-\theta t)/\tan(\theta i+\theta t) \quad (4)$$

$$R_S=-\sin(\theta i-\theta t)/\sin(\theta i+\theta t) \quad (5)$$

Here, when the angle of incidence is equal to Brewster's angle, that is, when $\theta i+\theta t=90°$, $\tan(\theta i+\theta t)=\infty$ and $\sin(\theta i+\theta t)=1$. Accordingly, the amplitude $R_S$ of S-polarized light becomes a value conforming to the refractive index of the thin film, while the amplitude $R_P$ of P-polarized light becomes zero and thus, the P-polarized light is all transmitted through the object surface. Also, if $\theta i+\theta t<90°$ (or $>90°$), $0<\sin(\theta i+\theta t)<1$ and accordingly, the sign of the amplitude $R_S$ of S-polarized light in equation (5) does not change, while $\tan(\theta i+\theta t)>0$ (or $<0$) and accordingly, the sign of the amplitude $R_P$ of P-polarized light in equation (4) is reversed.

When the angle of incidence $\theta i$ of the light beam $L_0$ onto the surface 55 is smaller than Brewster's angle (that is, $\theta i+\theta t<90°$), as shown in FIG. 6A, P-polarized light (arrows P1 and P2 parallel to the plane of the drawing sheet) and S-polarized light (arrows S1 and S2 perpendicular to the plane of the drawing sheet) are both in the same direction with respect to the reflected light L11 and the reflected light L12 and there is no phase shift therebetween. However, when the angle of incidence $\theta i$ is greater than Brewster's angle ($\theta i+\theta t>90°$), as shown in FIG. 6B, S-polarized light is unchanged, while the P-polarized light in the reflected light L11 is reversed by 180°, unlike the case of FIG. 6A. That is, as regards the P-polarized light in the reflected light L11, the angle of incidence $\theta i$ is reversed in phase with Brewster's angle as the boundary.

With regard also the multiple times reflected lights L13, L14, . . . shown in FIG. 3, like the reflected light L12, it is considered that P-polarized light is reversed by 180° relative to the reflected light L11. The substrate 53 is usually formed of silicon, aluminum or the like, and the reflected light from these substances also causes phase deviation when the angle of incidence is great. However, since in the thin film (photoresist) 54, the angle of incidence $\theta a$ is smaller than Brewster's angle, little or no phase deviation is caused and as a result, when the angle of incidence $\theta i$ onto the surface 55 is greater than Brewster's angle, P-polarized light becomes about 180° out of phase also with S-polarized light.

Figure 7A:
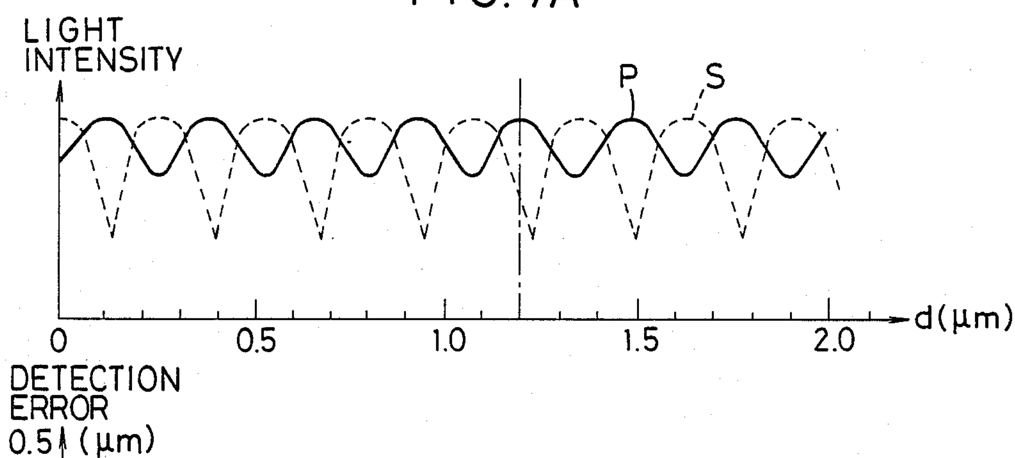
FIGS. 7A and 7B are graphs respectively showing variations in the light intensities of P-polarized light and S-polarized light for the film thickness and a detection error for the film thickness.
Figure 7B:
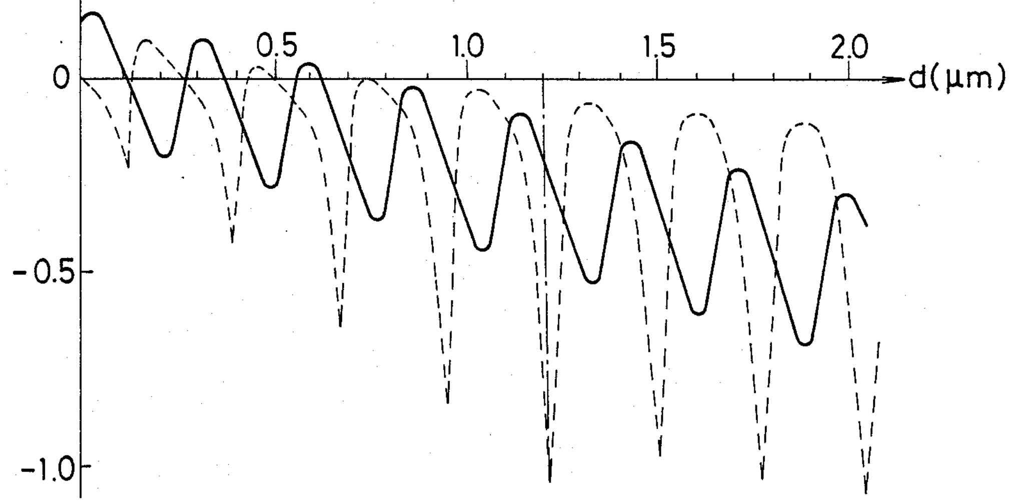

There will now be shown an example of the simulation of the coherent light of P-polarized light and the coherent light of S-polarized light in which even the multiple times reflected lights L13, L14, . . . are taken into consideration. FIG. 7A shows variations in the intensities of the coherent lights for a variation in the thickness d of the thin film, and FIG. 7B shows a detection error for the actual surface position. The solid line indicates the curve by P-polarized light, and the broken line indicates the curve by S-polarized light. In this case, it is assumed that the light beam $L_0$ from the light source 1 is a monochromatic light of wavelength λ740 μm and this light beam $L_0$ is projected onto the surface of a semiconductor wafer comprising a silicon substrate (complex refractive index $n_s=3.71+0.01i$), an aluminum layer (complex refractive index $n_{AL}=1.44+5.2i$) attached to the surface of the silicon substrate to a thickness of 1 μm, and photoresist (complex number $n_R=1.64+0.002i$) deposited thereon, at an angle of incidence $\theta=70°$, by the use of objective lenses 41 and 42 having a numerical aperture NA=0.1.

As is apparent from FIG. 7A, between P-polarized light (solid line) and S-polarized light (broken line), the period of the strength and weakness of light by the interference effect deviates by approximately a half period (180°) and when the light intensity thereof becomes correspondingly weak, a position far below the photoresist (in which the amount of deviation from the surface is great) is detected as shown in FIG. 7B and thus, the detection error is great. For example, examining the intensities of the coherent lights and the detection error for the film thickness of 1.2 μm, P-polarized light (solid line) is maximum in intensity and moreover, the detection error is small and thus, the state of FIG. 4C is assumed. Conversely, however, with regard to S-polarized light, the intensities of the coherent lights are in the vicinity of minimum and the detection error is great and thus, the state of FIG. 4D is assumed. So, when the two P-polarized light and S-polarized light are combined together, it means that the distributions of quantity of light of FIGS. 4C and 4D are applied coherently, and the centroid of the quantity of light thereof is drawn back toward the higher light intensity (for example, in the direction of FIG. 4C).

Figure 8:
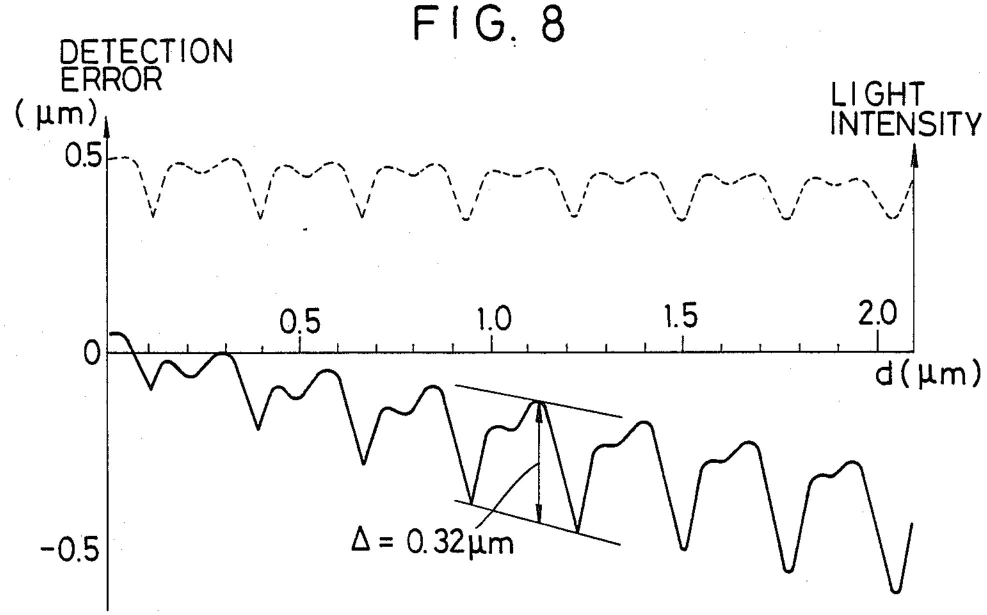
FIG. 8 is a graph showing a variation in the light intensity and a detection error for the film thickness.

FIG. 8 shows the result of the combination of P-polarized light and S-polarized light shown in FIGS. 7A and 7B. In FIG. 8, the broken line curve indicates a variation in the intensity of the coherent light for a variation in the film thickness, and the solid line curve indicates a detection error for the actual surface position. As can be seen in FIG. 8, the variation in the light intensity by the interference becomes smaller and the detection error Δ is still within the range of 0.32 μm for the film thickness in the vicinity of 1.1 μm. However, if the ratio between the intensities of P-polarized light and S-polarized light is suitably changed by the use of means which will be described just below, it will be possible to minimize the detection error (the fluctuation of the detection error by a variation in the film thickness, indicated by $\Delta X_2$ in FIG. 5).

Figure 9:
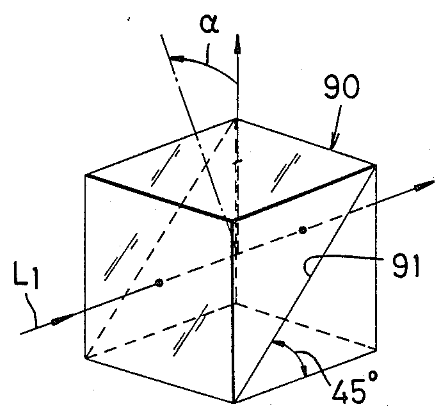
FIG. 9 is a perspective view showing a polarizing prism.
Figure 10:
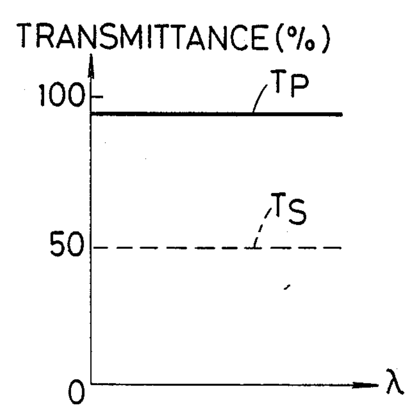
FIG. 10 is a graph of light ray transmittances.

In order to improve the detection error of the surface position by the above-described interference, a correcting optical system 9 is provided between the objective lens 42 and the slit plate 6, as shown in FIG. 1. This correcting optical system 9 is constituted by a polarizing prism 90 as shown in FIG. 9. The reflecting surface 91 of the polarizing prism 90 comprises a coating of dielectric multi-layer film applied to a cemented surface inclined at 45°, and as shown in FIG. 10, the transmittance $T_P$ thereof for P-polarized light is approximately 100% and the transmittance $T_S$ thereof for S-polarized light is approximately 50%. Accordingly, the intensity ratio between the P-polarized light and S-polarized light of the light transmitted through this polarizing prism 90 can be rendered into about 2:1. This ratio is very effective for the correction of the detection error in a case where the reflecting surface 56 between the thin film 54 and the substrate 53 is formed by an aluminum film.

Now, depending on the refractive index characteristics of the substrate and thin film, it is in some cases preferable to change the ratio between P-polarized light and S-polarized light to a value differing from said value. For example, by changing the characteristic of the reflecting surface 91, it is possible to change the ratio between P-polarized light and S-polarized light freely. Alternatively, by rotating this polarizing prism in the direction α about the optic axis of incidence, it is possible to change the ratio between P-polarized light and S-polarized light.

Figure 11:
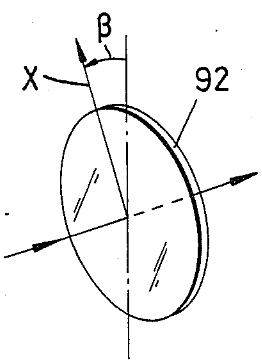
FIG. 11 is a perspective view showing a polarizing plate.

Also, the correcting optical system 9 may be replaced by a polarizing plate 92 as shown in FIG. 11. In such case, by rotating the polarization axis in the direction β, it is possible to change the ratio between P-polarized light and S-polarized light. That is, assuming that the polarization axis X is rotated by β relative to the incidence surface containing the optic axis of the light beam $L_0$ and perpendicular to the object surface, the transmittance for P-polarized light is $\cos^2\beta$ and the transmittance for S-polarized light is $\sin^2\beta$, and by suitably adjusting the angle $\beta$, it is possible to provide a desired ratio. Also, if design is made such that the transmittances of the polarizing prism 90 shown in FIG. 9 are $T_P=100\%$ and $T_S=0\%$, the polarizing prism 90 can be used just in the same manner as the aforementioned polarizing plate 92.

Figure 12:
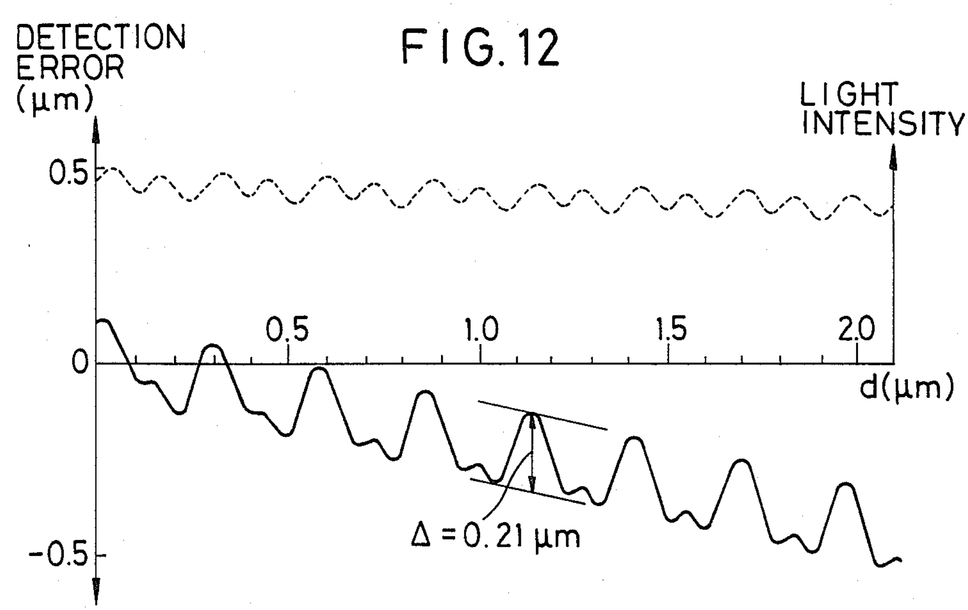
FIG. 12 is a graph showing a variation in the light intensity and a detection error for the film thickness.

FIG. 12 specifically shows the variations in the intensities of the coherent lights and the detection error when, by rotatably providing the correcting optical system 9 on the detection optic axis shown in FIG. 1, P-polarized light and S-polarized light are combined together with their ratio as 1:0.35, under optical conditions similar to those in the case of FIG. 7. As is apparent from FIG. 12, the detection error range $\Delta=0.21$ μm for the thickness of the thin film in the vicinity of 1.1 μm, and this shows an improvement in accuracy as compared with $\Delta=0.32$ μm shown in FIG. 8. That is, by relatively weakening S-polarized light, the detection error by the S-polarized light is reduced to achieve an improvement in accuracy. It is also seen that the variations in the intensities of the coherent lights are narrowed in the width of strength and weakness and thus improved, as compared with the variations in the intensities shown in FIG. 8.

Although in the above-described embodiment, the correcting optical system 9 is provided on the reflection optical path on the light-receiving side, it may be provided on the incidence optical path on the light-emitting side, namely, between the light source and the object surface, to obtain a similar correction effect. In that case, if the correcting optical system 9 is a polarizing prism, it is desirable to provide it on the portion of the optical path which is as near as possible to the parallel light beam. However, if the opening angle of the light beam is small, the transmittances of the P-polarized light component and the S-polarized light component do not vary very much and therefore, the location at which the correcting optical system is installed need not be specifically restricted.

Also, in the embodiment of FIG. 1, the light source used is one of random polarization, but where a light source emitting a linearly polarized light, for example, a semiconductor laser or a linear polarization type laser is used as the light source 1, a rotatable half-wave plate may be used as the correcting optical system. Alternatively, the plane of polarization may be rotatively adjusted by the utilization of a Faraday element whose plane of polarization can be rotated about the optic axis by controlling a magnetic field, or an element having optical activity of light (natural optical activity), for example, a quartz plate. However, in the case of a quartz plate, a single quartz plate of predetermined thickness or a combination of a plurality of such quartz plates is inserted in the optical path to rotate the plane of polarization by a predetermined amount.

It is possible to incline the plane of polarization of the light source with respect to the incidence surface by the use of the polarizing optical means such as the half-wave plate, Faraday element or quartz plate to thereby change the relative ratio between the intensities of the P-polarized light component and the S polarized light component.

If a multi-wavelength light source is used as the light source 1 and the coherence of the reflected light is reduced by polychromatic light, it will be possible to further improve the detection accuracy. Also, design may be made such that the centroid of the quantity of light is detected by one of various detectors such as a CCD type solid state image pickup device, a PSD and an image pickup tube.

Description will now be made of a second embodiment of the present invention in which a correcting optical system is disposed in the incidence optical path between the light source and the object surface.

Figure 13:
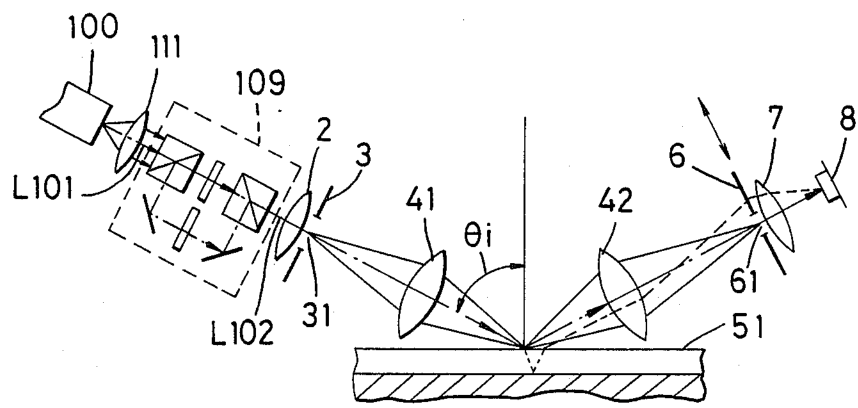
FIG. 13 schematically shows the construction of an optical system according to a second embodiment of the present invention.

In FIG. 13, the light source 100 produces a non-polarized (random polarized) or circularly polarized light beam. This light beam is made into a substantially parallel light beam L101 by a collimator lens 111 and enters a correcting optical system 109, and emerges as a composite emergent light beam L102 with the P-polarized light component and the S-polarized light component being changed into a suitable light intensity ratio. This composite light beam L102 thereafter passes through a field lens 2 and a slit opening 31 in a slit 3 provided near the field lens, as in FIG. 1, and is projected onto the object surface 51 through an objective lens 41 at an angle of incidence $\theta i$ greater than Brewster's angle.

The reflected light from the surface 51 is re-imaged on a slit plate 6 by an objective lens 42.

Figure 14:
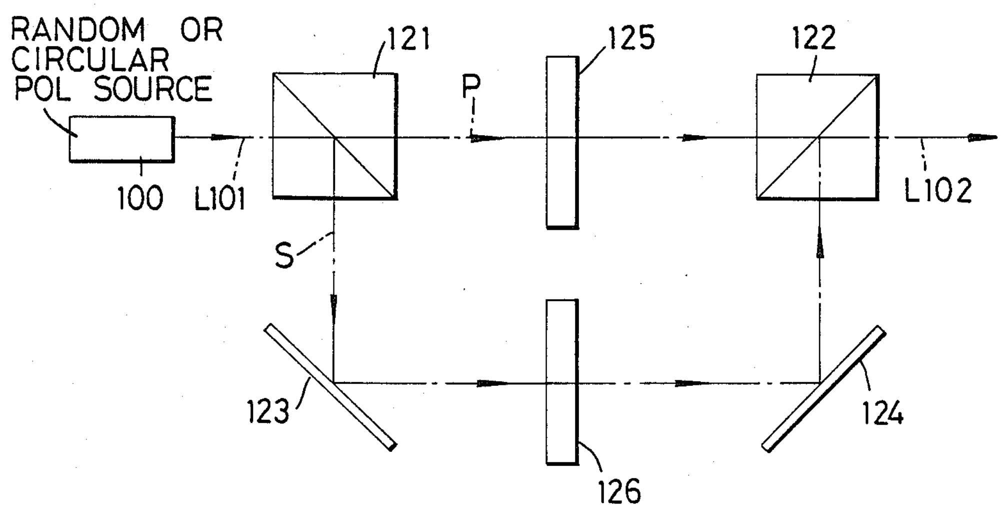
FIG. 14 is an optical arrangement diagram showing the construction of the correcting optical system of FIG. 13.

FIG. 14 shows the specific construction of the correcting optical system 109. A first polarizing prism 121 and a second polarizing prism 122 are constructed similarly to those in FIG. 9. A light beam L101 entering the first polarizing prism 121 is separated by the joined surface thereof into a P-polarized light component parallel to the incidence surface and an S-polarized light component perpendicular to the incidence surface and equal in intensity to the P-polarized light component, and the P-polarized light component is transmitted through the joined surface and travels toward the second polarizing prism 122. The S-polarized light component is reflected by the joined surface and travels via two mirrors 123 and 124 toward the second polarizing prism 122. The P-polarized light is transmitted through the joined surface of the second polarizing prism 122, and the S-polarized light is reflected by the joined surface, and the P-polarized light and the S-polarized light are combined together and emerge as a composite light beam L102.

Density filters 125 and 126 whose transmittances can be changed as desired are respectively provided on the two optical paths between the first polarizing prism and the second polarizing prism, and the both density filters can have their transmittances changed from approximately 100% to 0% as desired. Also, the incident light L101 is divided by the first polarizing prism into P-polarized light and S-polarized light equal in intensity to each other without any loss of energy, and the divided P-polarized light and S-polarized light are combined together by the second polarizing prism without any loss of energy. Thus, where the transmittances of the two density filters are set to 100%, the light intensity of the composite light beam L102 becomes substantially equal to that of the incident light L101. In this case, assuming that the intensity of the incident light L101 is 100, the intensities of the P-polarized light and S-polarized light included in the composite light beam L102 are respectively 50, and such light intensities of the P-polarized light and S-polarized light can be freely changed between 50 to 0 by the density filters 125 and 126, respectively, and the intensity ratio between the P-polarized light and the S-polarized light can be changed as desired to thereby provide the composite light beam L102.

Figure 15:
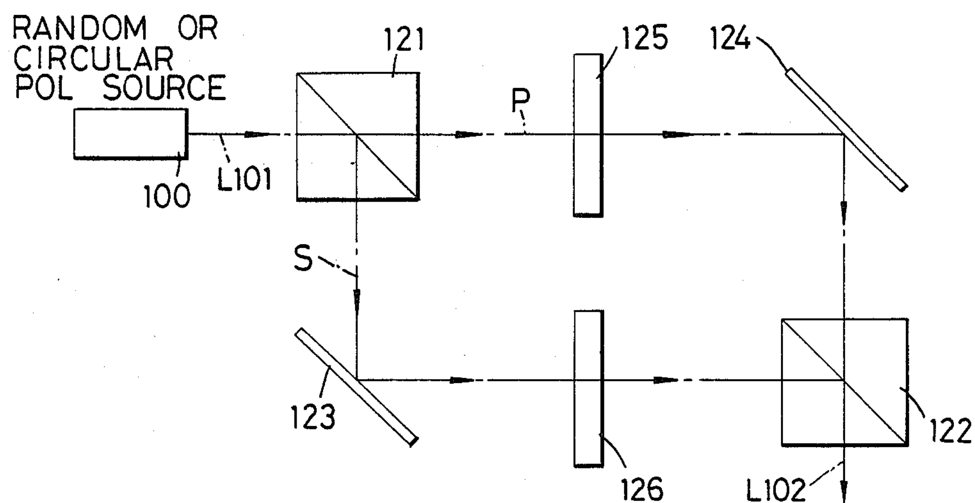
FIGS. 15, 16. 17 and 21 are optical arrangement diagrams showing modifications of the correcting optical system.
Figure 16:
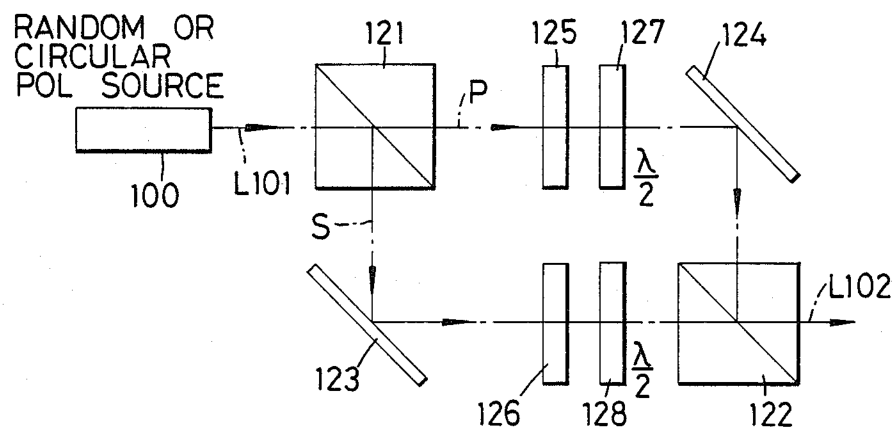

By constructing the correcting optical system 109 as shown in FIGS. 15 and 16, it is possible to make the optical path length of the P-polarized light and the optical path length of the S-polarized light equal to each other. That is, the construction shown in FIG. 15 is such that the position of the second polarizing prism 122 is replaced with the position of the mirror 124. Accordingly, in this case, the direction of travel of the beam L102 is orthogonal to the direction of travel of the beam L101.

In the construction of FIG. 16, the optical path lengths of the P-polarized light and the S-polarized light are equal to each other and the beam L102 can be made to emerge in the same direction as the beam L101.

In FIG. 16, on the respective optical paths of the P-polarized light and the S-polarized light which are equal in optical path length to each other, there are provided half wave plates 127 and 128 adjacent the density filters 125 and 126, and the P-polarized light and the S-polarized light have their directions of polarization rotated through 90° by these half-wave plates The light beam of the P-polarized light component is reflected by the joined surface of the second polarizing prism 122, and the light beam of the S-polarized light component is transmitted through the same joined surface, and the composite light beam L102 emerges in a direction parallel to the beam L101.

In FIGS. 14 to 16, the polarizing filter 92 shown in FIG. 11 may be used instead of the density filters 125 and 126. Also, in FIGS. 14 and 15, half-wave plates may be provided instead of the density filters 125 and 126 and the polarized light components can be adjusted by suitably rotating them. In this case, when the angle of rotation of the half-wave plates is $\theta$, each polarized light component is proportional to $\cos^2(2\theta)$.

Figure 17:
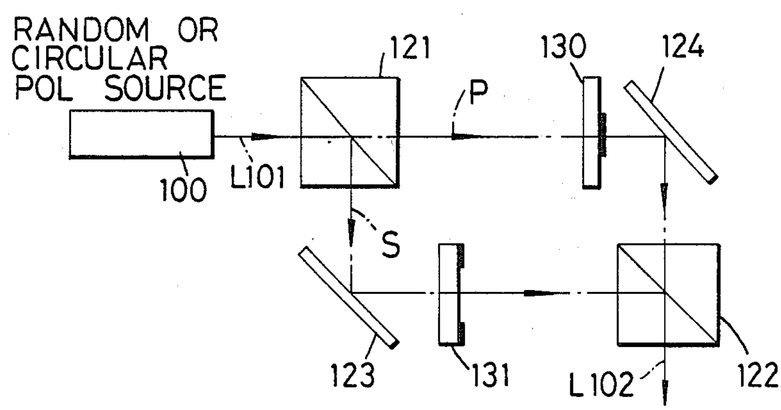
Figure 18:
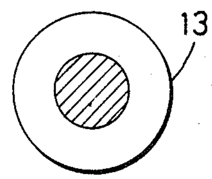
FIGS. 18 and 19 are plan views showing the filters 130 and 131, respectively, of FIG. 17.
Figure 19:
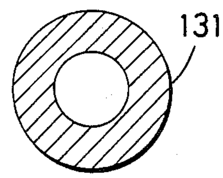

The correcting optical system 109 may be constructed as shown in FIG. 17, whereby there can be provided a composite light beam whose direction of polarization differs between the central portion and the marginal portion. On the optical path of the P-polarized light, as shown in FIG. 18, there is provided a rotatable polarizing filter 130 having its central portion shielded from light, and on the optical path of the S-polarized light, as shown in FIG. 19, there is provided a rotatable polarizing filter 131 having its marginal portion shielded from light. Also, these two polarizing filters 130 and 131 are disposed at such positions that the optical path lengths to the second polarizing prism 122 are equal to each other.

Figure 20:
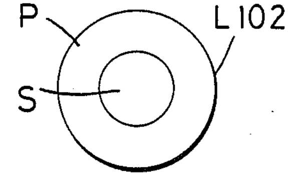
FIG. 20 shows the distribution of the emergent light beam from the optical system of FIG. 17.
Figure 21:
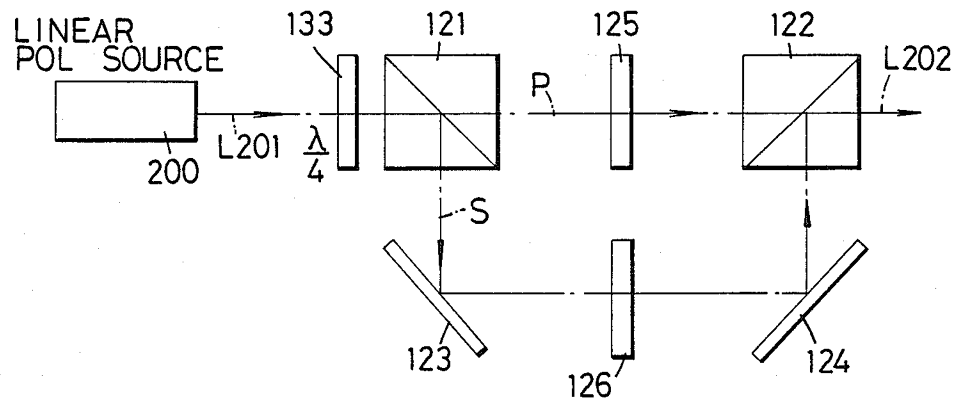

Thus, the composite emergent light L102 emerging from the second polarizing prism has its central portion providing an S-polarized light component and has its marginal portion providing a P-polarized light component, as shown in FIG. 20, and by rotating the polarizing filters 130 and 131 by a suitable angle, it becomes possible to change the ratio between the quantity of light of the marginal portion of the composite light beam and the quantity of light of the central portion of the composite light beam as desired.

Where use is made of a light source which emits a linearly polarized light, the correcting optical system 109 can be constructed as shown in FIG. 21. That is, a quarter-wave plate 133 is provided on the optical path between a light source 200 which emits a linearly polarized light and a first polarizing prism 121, whereby the linearly polarized light becomes a circularly polarized light, which enters the first polarizing prism 121. The incident light beam of this circularly polarized light, as in the case of FIGS. 14–17, is separated by the first polarizing prism 121 into a P-polarized light and an S-polarized light which are equal in intensity to each other, and these P-polarized light and S-polarized light are combined together by a second polarizing prism 122.

In this case, the axis of the quarter-wave plate 133 may be fixed at 45° with respect to the directions of polarization of the P-polarized light and the S-polarized light. If this is done, the intensity ratio between the emerging P-polarized light component and S-polarized light component will be invariable as shown below even if the direction of polarization of the linearly polarized light changes.

Figure 22:
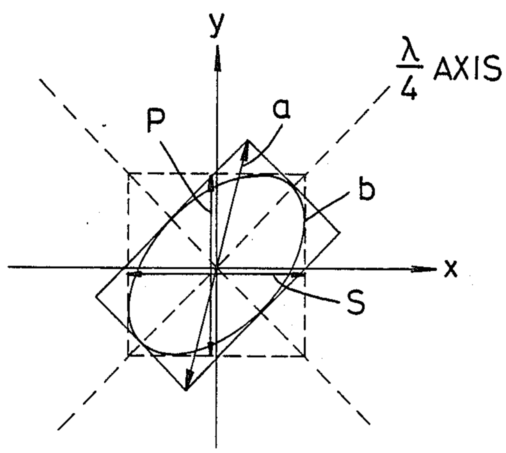
FIG. 22 illustrates the polarized condition.

In FIG. 22, assuming that the linearly polarized light entering the quarter-wave plate 133 is a and the polarized lights emerging from the first polarizing prism 121 are P and S, the axis of the quarter-wave plate is inclined by 45° with respect to the directions P and S and therefore, the light emerging from the quarter-wave plate 133 becomes an elliptically polarized light b whose axis of ellipse forms 45° with respect to the directions P and S. Accordingly, the intensities of the P-polarized and S-polarized lights separated by the first polarizing prism 121 become equal to each other. Therefore, if the intensity ratio between the P-polarized light and the S-polarized light is adjusted by the density filters 125 and 126, the intensity ratio between the P-polarized light and S-polarized light of the light beam L202 emerging from the second polarizing prism 122 will be invariable even if the direction of polarization of the linearly polarized light of the incident light beam L201 changes.

Figure 23:
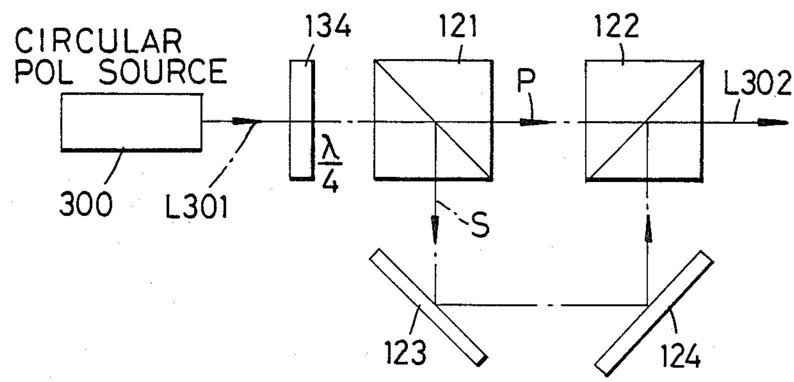
FIGS. 23, 24, 25, 26, 27, 29, 30, 31 and 32 are optical arrangement diagrams showing modifications of the correcting optical system.

The correcting optical system of FIG. 23 is designed to change the intensity ratio between the P-polarized light and the S-polarized light by the use of a quarter-wave plate, and in this case, a light source 300 emits a circularly polarized light. A quarter-wave plate 134 whose rotation is adjustable in a plane perpendicular to the optic axis of a light beam L301 is provided between the light source 300 and the first polarizing prism 121. The circularly polarized light is changed into a linearly polarized light by this quarter-wave plate, and the direction of polarization of the linearly polarized light can be inclined by any angle with respect to a plane perpendicular to the joined surface of the first polarizing prism 121 by rotating the quarter-wave plate by a suitable angle of rotation. Thus, by suitably changing the angle of inclination, the P-polarized light component and the S-polarized light component separated by the first polarizing prism 121 can be changed into any intensity ratio. This construction is free of any loss of light energy and therefore, the intensity of the composite emergent light L302 combined by and emerging from the second polarizing prism always assumes a value substantially equal to that of the incident light.

Figure 24:
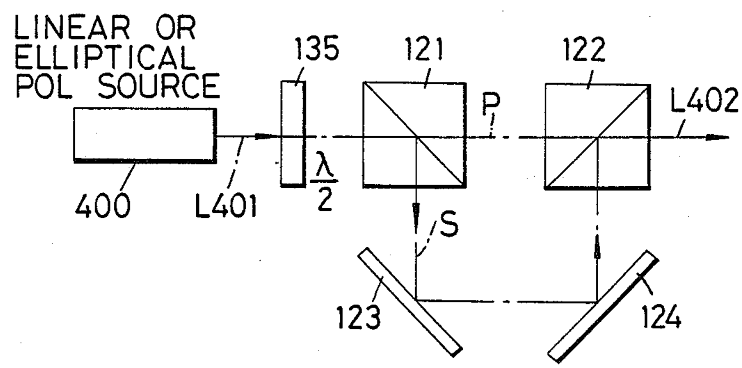

The correcting optical system of FIG. 24 is provided a light source 400 emitting a linearly polarized light or an elliptically polarized light and a half-wave plate 135. The mutually perpendicular x-direction component and y-direction component of the light passed through the half-wave plate 135 are 180° out of phase with each other. Accordingly, by suitably adjusting the rotation of the half-wave plate 135 in a plane perpendicular to a light beam L401, it is possible to change the intensity ratio between the P-polarized light component and the S-polarized light component separated by the first polarizing prism. Where the light beam L401 is a linearly polarized light, the intensity ratio can be freely changed between (0:100)—(50:50)—(100:0) as in FIG. 23.

Figure 25:
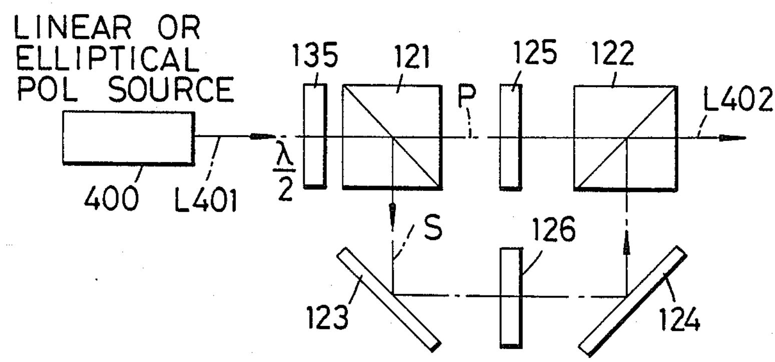

FIG. 25 shows an arrangement in which density filters 125 and 126 are added to the construction of FIG. 24. If this is done, the intensities of the P-polarized light component and the S-polarized light component can be changed by both of the half-wave plate and the density filters and therefore, with the loss of the energy of the incident light L401 minimized, the intensity ratio between the P-polarized and S-polarized light components even of an elliptically polarized light can be changed as desired. Further, the light source may of course be one which emits a circularly polarized light or a random-polarized light, as well as one which emits any polarized light.

Figure 26:
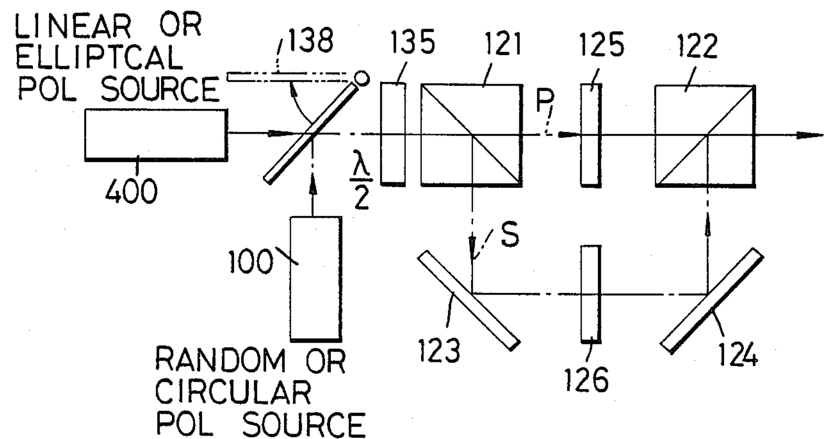

FIG. 26 shows an example of the correcting optical system using two (or more) light sources of different polarized conditions.

Light beams from a first light source 100 which emits a random-polarized light or a circularly polarized light and a second light source 400 which emits a linearly polarized light or an elliptically polarized light are changed over as desired by a change-over mirror 138 and enters the first polarizing prism through a half-wave plate 135.

A modification of the correcting optical system shown below has light modulating optical means for modulating the P-polarized light component and the S-polarized light component separated by the first polarizing prism 121, at a speed higher than the final time resolving power of the subsequent detector. The P-polarized light and S-polarized light changed into mutually incoherent lights by the light modulating optical means are combined together and emerge. Thus, even if the plane of polarization of one of the P-polarized light and the S-polarized light is rotated through 90° by the subsequent detecting optical system or the like and overlaps the plane of polarization of the other, the mutual incoherence is maintained and the irregularity of imaging and the creation of speckles caused by the interference of the P-polarized light and S-polarized light can be prevented.

Figure 27:
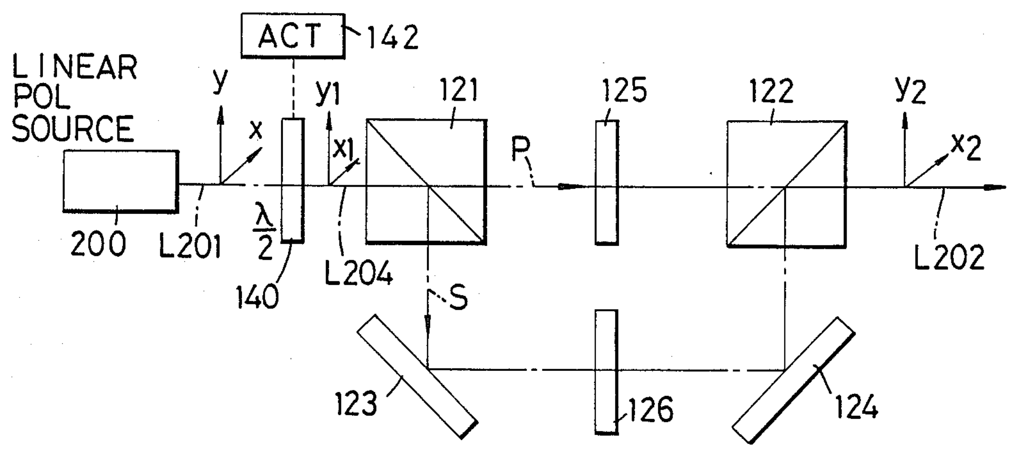

The correcting optical system of FIG. 27 is provided with a laser source 200 which emits a linearly polarized light and a half-wave plate 140. This half-wave plate 140 is rapidly rotated about a light beam L201 by an actuator 142. The speed of rotation of the half-wave plate is sufficiently higher than the time resolving power of the detector of FIG. 13.

Figure 28:
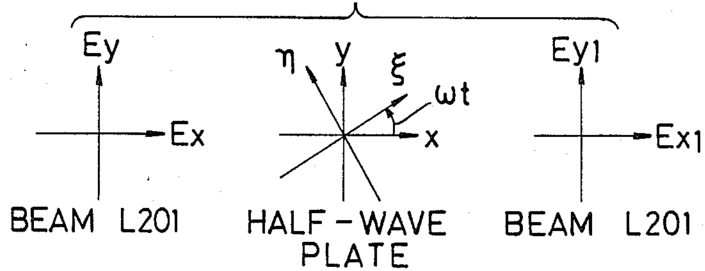
FIG. 28 illustrates the action of the half-wave plate of FIG. 23.

In FIG. 27, one polarized light component of the light beam L201 from the laser source 200 is $E_x$, the other polarized light component orthogonal thereto is $E_y$, and the polarized light components of a composite light beam L202 emerging from the second polarizing prism 122 are $E_{x2}$ and $E_{y2}$. In this case, S-polarized light corresponds to $E_x$ and P-polarized light corresponds to $E_y$. In FIG. 28, there are shown the directions of polarization of the polarized light components $E_x$ and $E_y$ of the light beam L201 from the laser source 200. It will be understood from FIG. 28 that when the angular velocity of the rotated half-wave plate 140 is a, the light beam L201 ($E_x$, $E_y$) becomes a light beam L204 expressed by $E_{x1}$, $E_{y1}$ of the following equation (6), by passing through the half-wave plate.

In FIG. 28, the symbols $\xi$ and $\eta$ indicate the axis of the half-wave plate 140, and it is to be understood that the light vibrating in the direction $\eta$ is delayed by $\lambda/2$ in phase with respect to the light vibrating in the direction $\xi$.

$$\begin{bmatrix} E_{x1} \\ E_{y1} \end{bmatrix} = \begin{bmatrix} \mathrm{Cos}\omega t & -\mathrm{Sin}\omega t \\ \mathrm{Sin}\omega t & \mathrm{Cos}\omega t \end{bmatrix} \begin{bmatrix} 1 & 0 \\ 0 & e^{i\pi} \end{bmatrix} \begin{bmatrix} \mathrm{Cos}\omega t & \mathrm{Sin}\omega t \\ -\mathrm{Sin}\omega t & \mathrm{Cos}\omega t \end{bmatrix} \begin{bmatrix} E_x \\ E_y \end{bmatrix} \quad (6)$$

The light of the P-polarized light component $E_{y1}$ passes through the first polarizing prism 121, the first density filter 125 and the second polarizing prism 122 in succession, and the then transmittance is $\alpha_y$ ($\alpha_y$: complex number, and $|\alpha_y| \leqq 1$). Also, the light of the S-polarized light component $E_{x1}$ passes through the first polarizing prism 121, the mirror 123, the second density filter 126, the mirror and the second polarizing prism 122 in succession, and when the then transmittance is $\alpha_x$($\alpha_x$: complex number, and $|\alpha_x| \leqq 1$), the composite light beam L202 ($E_{x2}$, $E_{y2}$) from the second polarizing prism 122 is represented by the following equation:

$$\begin{bmatrix} E_{x2} \\ E_{y2} \end{bmatrix} = \begin{bmatrix} \alpha_x & 0 \\ 0 & \alpha_y \end{bmatrix} \begin{bmatrix} E_{x1} \\ E_{y1} \end{bmatrix} \quad (7)$$

From equations (6) and (7), $$\begin{bmatrix} E_{x2} \\ E_{y2} \end{bmatrix} = \begin{bmatrix} \alpha_x & 0 \\ 0 & \alpha_y \end{bmatrix} \begin{bmatrix} \mathrm{Cos}\omega t & -\mathrm{Sin}\omega t \\ \mathrm{Sin}\omega t & \mathrm{Cos}\omega t \end{bmatrix} \begin{bmatrix} 1 & 0 \\ 0 & -1 \end{bmatrix} \begin{bmatrix} \mathrm{Cos}\omega t & \mathrm{Sin}\omega t \\ -\mathrm{Sin}\omega t & \mathrm{Cos}\omega t \end{bmatrix} \begin{bmatrix} E_x \\ E_y \end{bmatrix} = \begin{bmatrix} \alpha_x \mathrm{Cos}2\omega t & \alpha_x \mathrm{Sin}2\omega t \\ \alpha_y \mathrm{Sin}2\omega t & -\alpha_y \mathrm{Cos}2\omega t \end{bmatrix} \begin{bmatrix} E_x \\ E_y \end{bmatrix} \quad (8)$$

Here, both $\alpha_x$ and $\alpha_y$ are complex numbers, and the phase deviation resulting from the difference in optical path length is included in these amounts of $E_{x2}$ and $E_{y2}$. The coherence matrix $J_2$ of the light beam L202 ($E_{x2}$, $E_{y2}$) is represented by the following equation (9) if the time average is shown in $< \ >$ $$J_2 = < \begin{bmatrix} E_{x2} \\ E_{y2} \end{bmatrix}^{(Ex2^* \ Ey2^*)} > \quad (9)$$

When calculation is done with equation (8) substituted into equation (9), $$J_2 = \begin{bmatrix} \frac{1}{2}|\alpha_x^2|\{|E_x|^2 + |E_y|^2\}, & \frac{1}{2}\alpha_x\alpha_y^*(E_x^*E_y - E_xE_y^*) \\ \frac{1}{2}\alpha_x^*\alpha_y(E_xE_y^* - E_x^*E_y), & \frac{1}{2}|\alpha_y|^2\{|E_x|^2 + |E_y|^2\} \end{bmatrix} \quad (10)$$

Here, the incident light $L_0$ is a linearly polarized light and therefore, $E_x^*E_y - E_xE_y^* = 0$.

Accordingly, equation (10) becomes $$J_2 = \frac{1}{2}\{|E_x|^2 + |E_y|^2\} \times \begin{bmatrix} |\alpha_x|^2 & 0 \\ 0 & |\alpha_y|^2 \end{bmatrix} \quad (11)$$

and the diagonal component becomes zero.

This shows that the P-polarized light component ($E_y$) and S-polarized light component ($E_x$) of the composite light beam L202 do not interfere with each other. Also, when the transmittances $|\alpha_x|$ and $|\alpha_y|$ are both 1, that is, when the density filters 125 and 126 are adjusted so as to transmit 100% of light therethrough, the emergent energy of the light beam L202 is $$|E_x|^2 + |E_y|^2$$

and equals the energy of the light beam L201, and there is no loss of energy.

The mutual coherence of the P-polarized light component and S-polarized light component included in the composite light beam L202 has been described above in detail with the aid of mathematical expression, and schematically it can be understood as follows. The light L204 passed through the half-wave plate 140 being rotated is a linearly polarized light, but the plane of polarization thereof rotates at a speed twice as high as the speed of rotation of the half-wave plate 140. This means that the light passed through the half-wave plate 140 is modulated and becomes a random polarized light by the time average. Accordingly, the respective polarized light components separated by the first polarizing prism 121 subsequent to the half-wave plate 140 have no mutual coherence, and the intensities thereof can be adjusted as desired by the density filters 125 and 126, and the composite light beam including the P-polarized light component and S-polarized light component combined together at that adjusted intensity ratio and not interfering with each other emerge from the second polarizing prism 122.

Figure 29:
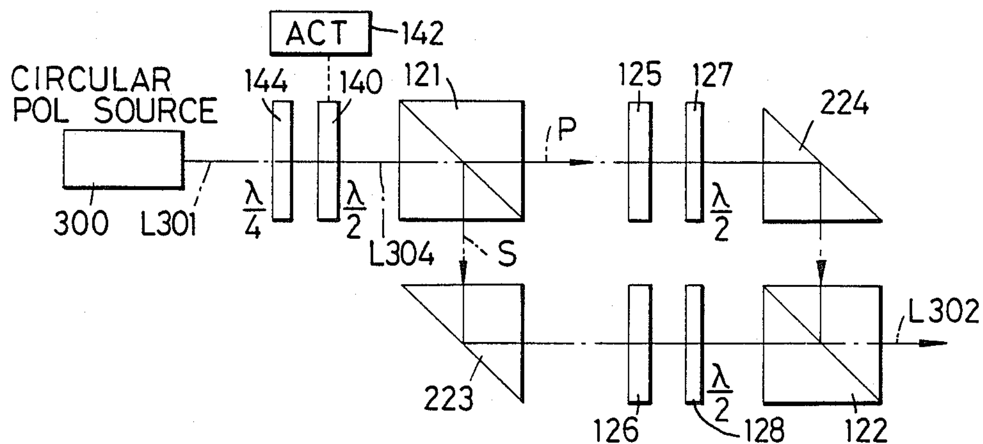

FIG. 29 shows a case where the laser beam emitted from the laser source is a circularly polarized light. A quarter-wave plate 144 and a half-wave plate 140 which is rotated are provided on the optical path of the circularly polarized laser beam L301 from the light source 300. The beam L301 is made into a linearly polarized light by the quarter-wave plate 144, and is made into a random polarized light L304 by the rotated half-wave plate 140 and enters the first polarizing prism 121. The incident light L1 is separated into P-polarized light and S-polarized light by the first polarizing prism 121. The process thereafter is the same as that described with reference to FIG. 16. Rectangular prisms 223 and 224 are functionally similar to the mirrors 123 and 124.

In FIG. 29, only a quarter-wave plate which is rotated can be used instead of the quarter-wave plate 144 and the half-wave plate 140 to make the P-polarized light component and S-polarized light component of the composite light beam L302 incoherent with each other. In such case, the circularly polarized light from the light source 300, when passed through the quarter-wave plate, becomes a linearly polarized light, and when the quarter-wave plate is rotated, the direction of polarization thereof is also rotated. Accordingly, it is equivalent to random polarized light when the time average is taken into consideration.

Also, where the light beam from the light source is a linearly polarized light as in FIG. 27, a fixed quarter-wave plate may be used to first make the linearly polarized light into a circularly polarized light, and this circularly polarized light beam may be made by a half-wave plate into a linearly polarized light whose direction of polarization is rotated, and then may be caused to enter the first polarizing prism.

Furthermore, a usual elliptically polarized light beam can be changed into a linearly polarized light by the use of a quarter-wave plate facing in a suitable direction and thereafter, P-polarized light and S-polarized light can be made incoherent with each other by a method similar to that described in connection with FIG. 27 and moreover, the intensity ratio therebetween can be changed as desired. Also, when an elliptically polarized light whose axes of ellipse face in the directions x and y passes directly through a rotating quarter-wave plate, the P-polarized light and S-polarized light separated by the polarizing prism become incoherent, and the separated P-polarized light and S-polarized light can be combined together with the intensity ratio therebetween being variable, as in the above-described embodiment. In this case, however, the P-polarized light and S-polarized light forming the light beam immediately after passed through the quarter-wave plate differ in intensity from each other and therefore, where a random light in which P-polarized light and S-polarized light are equal in intensity to each other is finally required, at least one of the polarized lights can be decreased by a filter.

If a phase modulating element or a Faraday polarizing element having a magneto-optical effect is used as the light modulating optical means, the present invention can also be applied to an apparatus of higher time resolving power.

Figure 30:
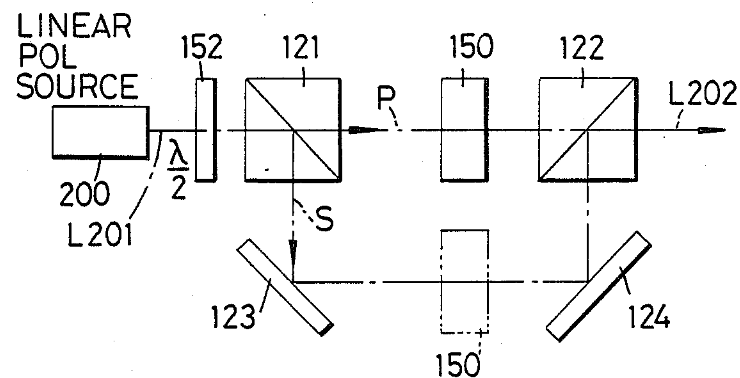

Referring to FIG. 30, instead of the rotated half-wave plate 140, a phase modulating element 150 is provided as the light modulating optical means on the optical path of one of the P-polarized light and S-polarized light separated by the first polarizing prism. The linearly polarized light beam L201 from the light source 200 passes through a half-wave plate 152 rotatively adjustable about the optic axis, and is separated by the first polarizing prism 121. In the light beam of the separated one polarized light (P-polarized light), there is provided a phase modulating element 150 using an electro-optical modulating element such as, for example, KDP (potassium dihydrogen phosphate).

The phase variation caused by the phase modulating element 150 is made sufficiently faster than the time resolving power of the subsequent detector or the like, whereby the P-polarized light component and S-polarized light component forming the composite emergent light L202 become incoherent with each other.

Where a source of circularly polarized light is employed, a rotatively adjustable quarter-wave plate may be provided instead of the half-wave plate 152, or a quarter-wave plate may be provided between the half-wave plate 152 and the light source.

Also, the phase modulating element 150 may be provided on the optical path of S-polarized light as indicated by phantom line. Furthermore, phase modulating elements may be provided on the optical paths, respectively, of P-polarized light and S-polarized light, but in such case, it is necessary to control the both phase modulating elements so as not to be turned with each other.

Figure 31:
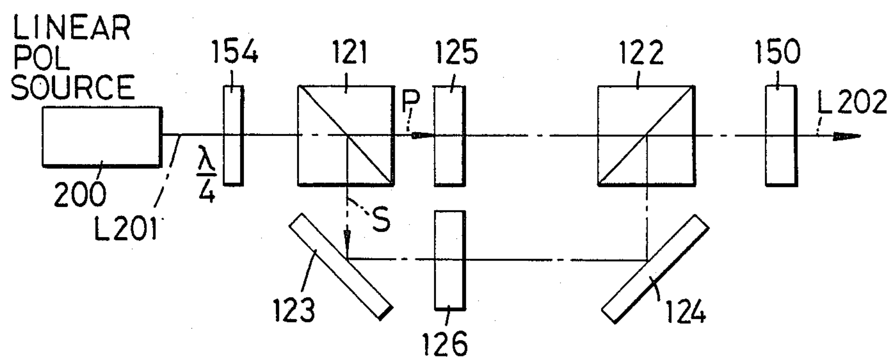

In FIG. 31, a phase modulating element 150 is provided rearwardly of the second polarizing prism 122 and a linearly polarized light beam L201 passes through a quarter-wave plate 154 provided with its axis inclined at 45° with respect to the directions P and S of the optical system. Accordingly, even if the direction of polarization of the incident linearly polarized light changes as described in connection with FIG. 22, the intensity ratio between P-polarized light and S-polarized light is unchanged.

Here, the axes of the phase modulating element 150 using electro-optical crystal in which double refraction occurs are made coincident with the directions P and S and the phase variation thereof is effected sufficiently rapidly, whereby the P-polarized light component and S-polarized light component forming the composite emergent light L202 can be made incoherent with each other.

Figure 32:
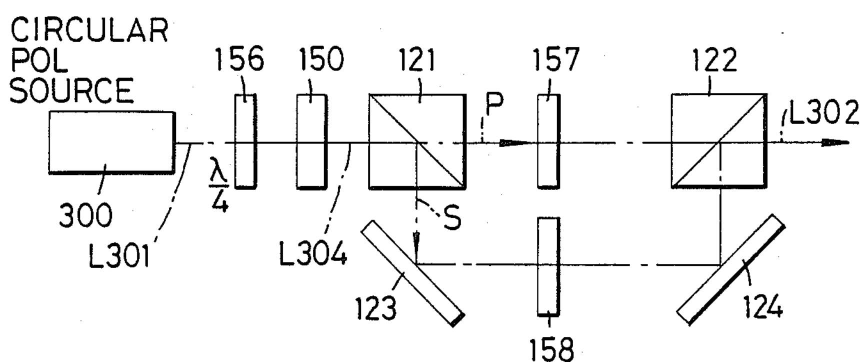

FIG. 32 shows an example in which the phase modulating element. 150 is provided forwardly of the first polarizing prism 121. A circularly polarized light beam L301 is made into a linearly polarized light forming an angle of 45° with respect to P-polarized and S-polarized lights, by a quarter-wave plate 156, and enters the phase modulating element 150 such as electro-optical crystal with the optic axis thereof being coincident with the directions P and S. The phase modulating element 150 varies the phase difference between the direction P and the direction S sufficiently rapidly. Therefore, the P-polarized light component and S-polarized light component of the light beam L304 emerging from the phase modulating element 150 become equal in intensity to each other and incoherent with each other. The light beam L304 is separated into P-polarized light and S-polarized light, and these separated polarized lights have their directions of polarization changed by polarizing plates or half-wave plates 157 and 158, and therefore the intensities of the P-direction component and S-direction component of the light beam L302 are changed. In this manner, there can be obtained a light beam in which the intensity ratio between mutually incoherent P-polarized light and S-polarized light has been changed into any value.

In each of the above-described embodiments, one of the polarizing prisms 121 and 122 may be replaced by an amplitude dividing optical system such as a half-mirror where the intensity of the composite light beam may be decreased to half.

I claim:

1. An apparatus for detecting the level of an object surface, comprising:

means for supplying a light beam obliquely incident on said object surface;

an imaging optical system provided to image said light beam reflected by said object surface;

means having a detecting surface coincident with the imaging plane of said imaging optical system and determining the level of said object surface on the basis of the position of the image of said light beam on said detecting surface; and polarization correcting optical means provided on an optical path leading from said beam supplying means via said object surface to said detecting surface for adjusting the intensity ratio between the two mutually orthogonal polarized light components of said light beam.

2. An apparatus according to claim 1, wherein said polarization correcting optical means includes a polarizing prism.

3. An apparatus according to claim 1, wherein said polarization correcting optical means includes a polarizing plate.

4. An apparatus according to claim 1, wherein said polarization correcting optical means includes separating optical means for separating the incident light into a pair of polarized light components whose directions of polarization are perpendicular to each other, means for arbitrarily adjusting the intensity ratio between said pair of polarized light components separated by said separating optical means, and combining optical means for combining the pair of polarized light components whose intensity of ratio has been changed by said adjusting means and for emitting them in one direction.

5. An apparatus according to claim 4, wherein said separating optical means includes first polarizing prism means and said combining optical means includes second polarizing prism means.

6. An apparatus according to claim 5, wherein said arbitrarily adjusting means includes filter means provided in at least one of two optical paths of said pair of polarized light components between said first and second polarizing prim means.

7. An apparatus according to claim 5, wherein said arbitrarily adjusting means include a wave plate member provided to be rotated about an optical axis of said incident light of said separating optical means.

8. An apparatus according to claim 4, wherein said separating optical means includes a first polarizing prism member having a surface functioning so that one of said pair of polarized light components is transmitted therethrough and the other of said pair of polarized light components is reflected.

9. An apparatus according to claim 4, wherein said polarization correcting optical means further includes light modulating optical means for eliminating mutual coherence of said pair of polarized light components combined by said combining optical means.

* * * * *